United States Patent [19]
Ohno et al.

[11] Patent Number: 6,087,694
[45] Date of Patent: Jul. 11, 2000

[54] SEMICONDUCTOR MEMORY DEVICE AND FABRICATION METHOD THEREOF

[75] Inventors: Yoshikazu Ohno; Yutaka Inaba; Junichi Tsuchimoto, all of Hyogo, Japan

[73] Assignee: Mitsubishi Denki Kabushiki Kaisha, Tokyo, Japan

[21] Appl. No.: 09/092,054

[22] Filed: Jun. 5, 1998

[30] Foreign Application Priority Data

Jan. 25, 1998 [JP] Japan ................................ 10-015405

[51] Int. Cl.⁷ .................................................. H01L 27/108
[52] U.S. Cl. ......................... 257/306; 257/308; 257/309; 438/255; 438/398
[58] Field of Search .................................... 438/253, 254, 438/255, 396, 397, 398; 257/306, 307, 308, 309, 532

[56] References Cited

U.S. PATENT DOCUMENTS

| 5,290,729 | 3/1994 | Hayashide et al. . |
| 5,366,917 | 11/1994 | Watanabe et al. . |
| 5,597,760 | 1/1997 | Hirota ..................................... 438/396 |
| 5,623,243 | 4/1997 | Watanabe et al. . |
| 5,843,829 | 12/1998 | Kuramae et al. ....................... 438/396 |

FOREIGN PATENT DOCUMENTS 3-263370  11/1991  Japan .

*Primary Examiner*—Carl Whitehead, Jr.
*Assistant Examiner*—Toniae M. Thomas
*Attorney, Agent, or Firm*—McDermott, Will & Emery

[57] ABSTRACT

A capacitor lower electrode is formed so as to be connected to a main surface of a silicon substrate. The capacitor lower electrode includes a plug portion, a bottom wall portion, and a vertical wall portion. An insulation layer for suppressing crystallization of the vertical wall portion is formed between the bottom wall portion and the vertical wall portion. A capacitor upper electrode is formed on the capacitor lower electrode with a capacitor dielectric layer therebetween.

6 Claims, 17 Drawing Sheets

SEMICONDUCTOR MEMORY DEVICE AND FABRICATION METHOD THEREOF

BACKGROUND OF THE INVENTION

1. Field of the Invention

The present invention relates to semiconductor memory devices and manufacturing method thereof, and more particularly, to a semiconductor memory device having the surface of one electrode of the capacitor subjected to a corrugation process, and a method of fabricating such a semiconductor memory device.

2. Description of the Background Art

In accordance with increase in the integration density of a semiconductor memory device such as a DRAM (Dynamic Random Access Memory), the elements used in a semiconductor memory device is further reduced in size. Particularly in a DRAM, the capacitor for storing charge is reduced in size, so that the amount of charge that can be stored in a similar device structure is reduced. Measures for noise generated within a semiconductor substrate is a critical element for the reliability of a DRAM device. Soft error is known as one erroneous operation caused by noise. A small amount of the α-ray emitted from the package and wiring material of a semiconductor memory device is introduced into the silicon substrate to generate electron-hole pairs. These charges become the noise with respect to the charge stored in a memory cell to alter the stored signal. This is the phenomenon of the commonly known soft error. Introduction of charge from a peripheral circuit is known as another noise. Potential difference is generated between the memory cell portion and the peripheral circuit portion by fluctuation in the power supply voltage, whereby noise charge is introduced into the memory cell.

One effective measures with respect to such noise is to increase the amount of charge that is accumulated. However, in a device structure that is similar to that of a conventional one, the amount of stored charge is reduced in accordance with increase in the integration density and microminiaturization of the DRAM. An approach is proposed to ensure capacitance of the capacitor by applying a cylindrical type or fin type stacked capacitor for the DRAM. Furthermore, increasing the surface area by rendering the surface of the electrode of the capacitor in a corrugated manner to accommodate further microminiaturization has been considered.

A conventional DRAM having the surface of the electrode of a capacitor formed in a corrugated manner will be described with reference to FIG. 31. FIG. 31 is a sectional view of an example of such a conventional DRAM.

Referring to FIG. 31, an element isolation oxide film 2 is selectively formed at a main surface of a silicon substrate 1. MOS transistor 3a, 3b and 3c are formed at an element formation region surrounded by element isolation oxide films 2. MOS transistor 3a includes impurity diffusion layers 5a and 5b that become the source/drain regions, and a gate electrode 4a formed on the main surface of silicon substrate 1 with a gate insulation layer thereunder. MOS transistor 3b includes impurity diffusion layers 5b and 5c, and a gate electrode 4b. MOS transistor 3c includes impurity diffusion layers 5d and 5e, and a gate electrode 4d. A gate electrode 4c of another MOS transistor extends on element isolation oxide film 2.

Sidewall insulation layers 6a, 6b, 6c, 6d, 6e, 6f, 6g and 6h are formed respectively on the sidewalls of gate electrodes 4a, 4b, 4c and 4d. Insulation layers 7a, 7b, 7c and 7d are formed on gate electrodes 4a, 4b, 4c and 4d, respectively.

A first interlayer insulation layer 8 is formed on the main surface of silicon substrate 1 so as to cover gate electrodes 4a–4d. Contact holes 8a and 8b are formed at predetermined positions of first interlayer insulation layer 8. Plug electrodes 9a and 9b are formed in contact holes 8a and 8b, respectively. A bit line 10 is formed on plug electrode 9a. An interconnection layer 11 is formed on plug electrode 9b.

A second interlayer insulation layer 12 is formed so as to cover bit line 10 and interconnection layer 11. Contact holes 12a and 12b are formed so as to pierce second and first interlayer insulation layers 12 and 8. Contact hole 12a reaches impurity diffusion layer 5a. Contact hole 12b reaches impurity diffusion layer 5c.

A plug portion 13a of a capacitor lower electrode 13 is formed in contact hole 12b. A bottom wall portion 13b of capacitor lower electrode 13 is formed above plug portion 13a. A vertical wall portion 13c of capacitor lower electrode 13 is formed so as to be connected to a side surface of bottom wall portion 13b. A plug portion of another capacitor lower electrode is formed in contact hole 12a.

The surfaces of bottom wall portion 13b and vertical wall portion 13c are formed in a corrugated manner. A capacitor dielectric layer 15 is formed to cover this surface. A capacitor upper electrode 16 is formed to cover capacitor dielectric layer 15. A third interlayer insulation layer 17 is formed to cover capacitor upper electrode 16. A contact hole 17a is formed to pass through first, second, and third interlayer insulation layers 8, 12 and 17. An interconnection layer 18d is formed in contact hole 17a. Interconnection layers 18a, 18b and 18c are respectively formed above third interlayer insulation layer 17.

The process of rendering the surface of vertical wall portion 13c and bottom wall portion 13b in a corrugated manner will be described hereinafter. In the present specification, it is defined that the process of rendering the surface of an element in a corrugated manner to become a concave and convex surface is referred to as a corrugated process. This corrugation process is disclosed in, for example, Japanese Patent Laying-Open No. 3-263370. The surface of vertical wall portion 13c and the surface of bottom wall portion 13b can be rendered in a corrugated manner by the method disclosed in this publication.

In order to apply the above-described corrugation process on bottom wall portion 13b and vertical wall portion 13c of capacitor lower electrode 13 to achieve increase in the surface area, bottom wall portion 13b and vertical wall portion 13c must be amorphous.

The corrugation process is carried out at a temperature of approximately 570° C.–590° C., for example. Therefore, plug portion 13a in contact with the main surface of silicon substrate 1 is crystallized during the corrugation process. Bottom wall portion 13b and vertical wall portion 13c are no longer amorphous if the crystallization is effected up to bottom wall portion 13b and vertical wall portion 13c. There was problem of reduction in the increase of the surface area by the corrugation process.

SUMMARY OF THE INVENTION

In view of the foregoing, an object of the present invention is to provide a semiconductor memory device that can have the surface area increase improved by a corrugation process.

According to an aspect of the present invention, a semiconductor memory device includes a semiconductor substrate having a main surface, one electrode of a capacitor, and a crystallization suppress portion. The one electrode of the capacitor has a surface subjected to a corrugation process. The one electrode includes a first conductor connected to the main surface of the semiconductor substrate, and a second conductor electrically connected to the first conductor. The crystallization suppress portion is located between the first and second conductors to suppress crystallization of the second conductor. In the present specification, it is defined that "one electrode of the capacitor" also includes the plug portion connecting the relevant electrode and the surface of the semiconductor substrate.

By providing a crystallization suppress portion between the first and second conductors of one electrode of a capacitor, crystallization of the second conductor can be suppressed effectively during the corrugation process for rendering the surface of the one electrode of the capacitor into a corrugated manner. Therefore, at least the second conductor can be maintained in an amorphous state during the corrugation process, so that the surface area increase of the second conductor can be improved.

The crystallization suppress portion can be formed of a layer of an insulation material at a thickness of not more than 3 nm. The lower limit of the thickness for this insulation layer is the smallest value that can prevent crystallization of the first conductor to extend to the second conductor. It is considered that there is a specific value depending upon the material of the insulation layer.

By employing a layer of an insulation material as the crystallization suppress portion, it is considered that crystallization of the second conductor during the corrugation process can be suppressed. This is due to the fact that the presence of a layer of a material differing from that of the first conductor that is formed of a conductive material between the first and second conductors prevents the crystallization of the first conductor from extending to the second conductor. By setting the thickness of the layer of the insulation material to 3 nm and below, electrical connection between the first and second conductors by the tunnel effect can be implemented.

The crystallization suppress portion is formed of a compound of the material of the one electrode of the capacitor and at least one of nitrogen and oxygen. The crystallization suppress portion may be less than 3 nm in thickness.

It is considered that a material formed of a compound of the material of the one electrode of the capacitor and at least one of nitrogen and oxygen can be employed for the crystallization suppress portion. This is because the compound is formed of a material differing from that of the first conductor, likewise the case of the layer of an insulation material. By setting the thickness less than 3 nm for the present compound, electrical connection between the first and second conductors is allowed.

The first conductor can include a plug portion connected to the main surface, and a bottom wall portion formed on the plug portion. The second conductor may be a vertical wall portion connected to the side surface of the bottom wall portion with a crystallization suppress portion therebetween.

When the first conductor includes a plug portion and a bottom wall portion, and the second conductor is a vertical wall portion, a crystallization suppress portion is formed between the bottom wall portion and the vertical wall portion. By this presence of a crystallization suppress portion, the vertical wall portion can be suppressed effectively from being crystallized during the corrugation process. Therefore, the vertical wall portion can be maintained in an amorphous state during the corrugation process to improve the surface area increase of the vertical wall portion.

The first conductor may be a plug portion connected to the main surface of the semiconductor substrate. In this case, the second conductor includes a bottom wall portion formed on the plug portion with a crystallization suppress portion therebetween, and a vertical wall portion connected to the side surface of the bottom wall portion.

By providing a crystallization suppress portion between the plug portion and the bottom wall portion, crystallization of not only the vertical wall portion but also the bottom wall portion can be suppressed. Thus, the surface area increase of the capacitor lower electrode can be improved.

According to another aspect of the present invention, a method of fabricating a semiconductor memory device comprises the steps of forming a first conductor constituting a portion of one electrode of a capacitor on a main surface of a semiconductor substrate, forming a thin film of a material differing from the material of the first conductor on the surface of the first conductor, forming an amorphous second conductor constituting a portion of the one electrode on the surface of the thin film, applying a corrugation process on the surface of the second conductor to render the surface corrugated, and forming a capacitor dielectric layer so as to cover the first and second conductors.

By forming a second conductor on the surface of a thin film formed on the surface of a first conductor, the first and second conductors can be connected with a thin film therebetween. Therefore, crystallization of the second conductor can be suppressed effectively by virtue of the presence of the thin film even when the first conductor connected to the main surface of the semiconductor substrate is crystallized during the corrugation process applied on the one electrode of the capacitor. As a result, the surface area increase of the second conductor can be improved.

The method of fabricating a semiconductor memory device preferably includes the step of implanting ions into the thin film.

The conductivity of the thin film is increased by the ion-implantation step into the thin film. As a result, favorable electrical connection between the first and second conductors can be achieved.

The step of applying the corrugation process can include the step of applying a corrugation process in the state where impurities to improve conductivity are not introduced into the second conductor. Impurities are introduced into the second conductor after the corrugation process.

By applying the corrugation process on the second conductor with the impurities to improve the conductivity not yet introduced, the adverse effect of the impurities with respect to formation of the corrugated surface of the second conductor can be avoided. Thus, the second conductor can have the surface formed in a favorable corrugated manner. By introducing impurities to the second conductor after the corrugation process, the conductivity of the second conductor can be improved.

The step of introducing impurities can include the step of introducing impurities into the second conductor by diffusion.

When impurities are introduced into the second conductor by ion implantation after the corrugation process, the surface area increase may be degraded due to change in the corrugated configuration of the surface of the second conductor. By introducing impurities into the second conductor by diffusion which is a method other than the ion implantation method, favorable corrugated configuration is maintained. Therefore, degradation of the surface area increase of the second conductor can be prevented effectively.

The step of applying a corrugation process can include the step of implanting impurities into the second conductor prior to the corrugation process to destroy the crystal structure.

By implanting ions into the second conductor prior to the corrugation process to destroy the crystal structure, the second conductor can be rendered amorphous more completely. By applying a corrugation process on the second conductor of such a state, favorable corrugated configuration can be formed at the surface of the second conductor.

The first conductor can include a plug portion connected to the main surface of a semiconductor substrate, and a bottom wall portion formed on the plug portion. The second conductor may be a vertical wall portion connected electrically to a side surface of the bottom wall portion. The step of forming a thin film includes the step of forming a thin film on the side surface of the bottom wall portion. The step of applying a corrugation process can include the step of applying a corrugation process on both the bottom wall portion and vertical wall portion.

By forming a thin film on the side surface of the bottom wall portion, the bottom wall portion and the vertical wall portion can be connected with the thin film therebetween. Accordingly, crystallization of the vertical wall portion can be suppressed effectively during the corrugation process. A favorable corrugated surface of the vertical wall portion can be formed.

The first conductor can be a plug portion connected to the main surface of the semiconductor substrate. The second conductor includes a bottom wall portion formed on the plug portion, and a vertical wall portion connected to a side surface of the bottom wall portion. In this case, the step of forming a thin film includes the step of forming a thin film on the top surface of the plug portion. Also, the step of applying a corrugation process includes the step of applying the corrugation process on the bottom wall portion and the vertical wall portion.

By forming a thin film on the top surface of the plug portion, the plug portion can be connected to the bottom wall portion with the thin film therebetween. Accordingly, crystallization of the bottom wall portion can also be suppressed in addition to the vertical wall portion during the corrugation process. As a result, a favorable corrugated surface of the bottom wall portion can be formed in addition to the vertical wall portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to FIGS. 1–30.

First Embodiment

A DRAM according to an embodiment of the present invention and a method of fabrication thereof will be described hereinafter with reference to FIGS. 1–10.

Figure 1:
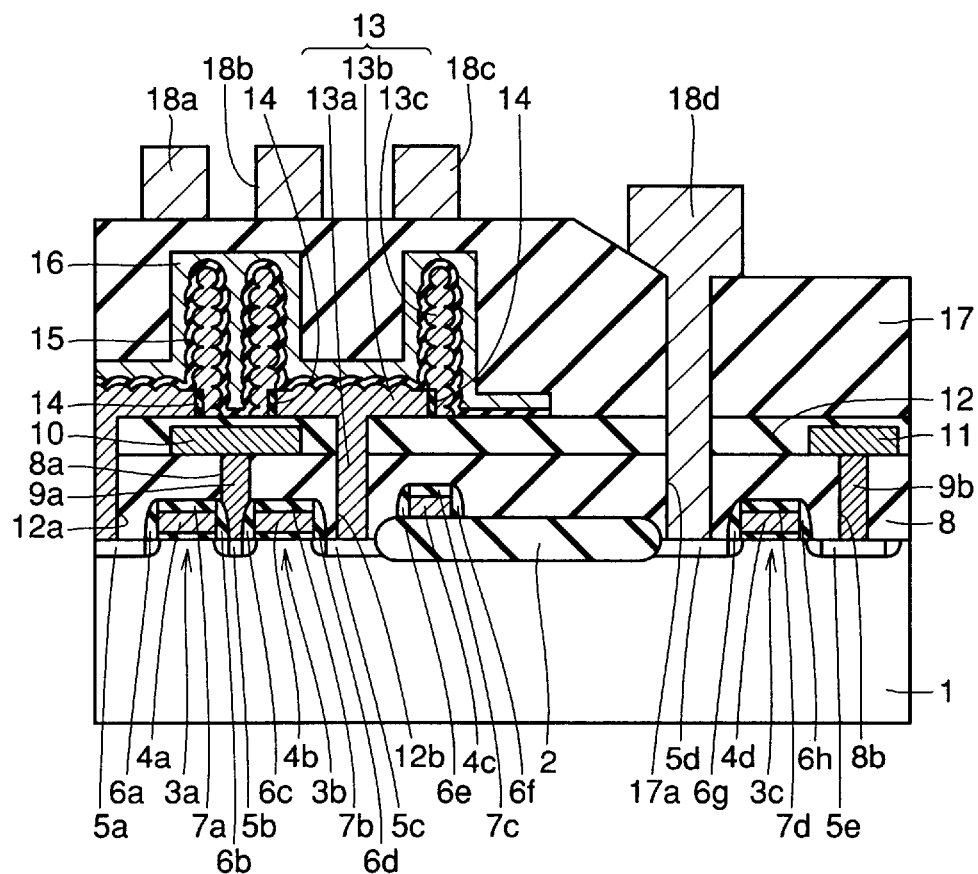
FIG. 1 is a sectional view of a DRAM according to a first embodiment of the present invention.

Referring to FIG. 1, an element isolation oxide film 2 is selectively formed on a main surface of a p type, for example, silicon substrate 1. Elements such as MOS transistors 3a, 3b, 3c, and the like are formed at respective element formation regions surrounded by element isolation oxide films 2.

MOS transistor (switch transistor) 3a includes n type, for example, impurity diffusion layers 5a and 5b that become the source/drain regions, and a gate electrode 4a formed on the channel formation region sandwiched by impurity diffusion layers 5a and 5b with a gate insulation layer thereunder. Impurity diffusion layers 5a and 5b have a LDD (Lightly Doped Drain) structure. Gate electrode 4a is formed of polysilicon having impurities doped.

MOS transistor (switch transistor) 3b includes impurity diffusion layers 5b and 5c, and a gate electrode 4b. MOS transistor 3c includes impurity diffusion layers 5d and 5e, and a gate electrode 4d. A gate electrode 4c of another MOS transistor extends on element isolation oxide film 2.

Sidewall insulation layers 6a, 6b, 6c, 6d, 6e, 6f, 6g, and 6h are respectively formed on the sidewalls of gate electrodes 4a, 4b, 4c, and 4d. Also, insulation layers 7a, 7b, 7c, and 7d, such as of silicon oxide are formed on gate electrodes 4a, 4b, 4c and 4d, respectively.

A first interlayer insulation layer 8 of silicon oxide and the like is formed on the main surface of silicon substrate 1 so as to cover MOS transistors 3a–3c. A contact hole 8a reaching impurity diffusion layer 5b and a contact hole 8b reaching impurity diffusion layer 5e are provided in first interlayer insulation layer 8.

Plug electrodes 9a and 9b such as of polysilicon doped with impurities, for example, are formed in contact holes Ba and 8b, respectively. A bit line 10 such as of WSi is formed on plug electrode 9a. An interconnection layer 11 of a material similar to that of bit line 10 is formed on plug electrode 9b.

A second interlayer insulation layer 12 such as of silicon oxide is formed so as to cover bit line 10 and interconnection layer 11. Contact holes 12a and 12b are formed through second interlayer insulation layer 12 and first interlayer insulation layer 8 to arrive at impurity diffusion layers 5a and 5c, respectively.

A plug portion 13a such as of crystallized silicon doped with impurities, for example, is formed in contact hole 12b. A bottom wall portion 13b is formed to cover plug portion 13a. Bottom wall portion 13b is formed of a material identical to that of plug portion 13a.

A crystallization suppress layer 14 is formed on the side surface of bottom wall portion 13b. Crystallization suppress layer 14 is formed of an insulation material such as silicon oxide ($SiO_2$), silicon nitride ($Si_3N_4$), and the like. A vertical wall portion 13c is formed so as to be connected to the side surface of bottom wall portion 13b with a crystallization suppress layer 14 therebetween. Vertical wall portion 13c may be formed of a material identical to that of plug portion 13a. A capacitor lower electrode 13 is formed by plug portion 13a, bottom wall portion 13b, and vertical wall portion 13c.

Bottom wall portion 13b and vertical wall portion 13c are subjected to a corrugation process to have the surface rendered into a corrugated (rough) manner as shown in FIG. 1. For example, when bottom wall portion 13b and vertical wall portion 13c are formed of amorphous silicon, the corrugation process includes the step of forming a silicon layer at the surface of bottom wall portion 13b and vertical wall portion 13c at the temperature of 570° C.–590° C. using monosilane gas as the material gas. The surface of both bottom wall portion 13b and vertical wall portion 13c can be formed in a favorable corrugated manner by maintaining an amorphous state without crystallization.

Since the corrugation process is carried out at a temperature of 570° C.–590° C., plug portion 13a is crystallized at the connecting portion with the main surface of silicon substrate 1. Therefore, bottom wall portion 13b in direct contact with plug portion 13a can be crystallized. However, by providing a crystallization suppress layer 14 of a different material between bottom wall portion 13b and vertical wall portion 13c as shown in FIG. 1, crystallization of bottom wall portion 13b extending to vertical wall portion 13c can be suppressed effectively. Therefore, crystallization of vertical wall portion 13c during the corrugation process can be suppressed to allow a favorable corrugated surface to be formed at vertical portion 13c.

Although crystallization suppress layer 14 serves to suppress crystallization of vertical wall portion 13c, crystallization suppress layer 14 also requires the function to establish electrical connection between bottom wall portion 13b and vertical wall portion 13c. Therefore, the thickness of crystallization suppress layer 14 is set to not more than 3 nm in the present invention. Such a thickness allows electrical connection between bottom wall portion 13b and vertical wall portion 13c by the tunnel effect. The lower limit value for the thickness of crystallization suppress layer 14 can be selected corresponding to the smallest value that can exhibit the crystallization suppress function.

Although silicon is denoted as the material for plug portion 13a, bottom wall portion 13b and vertical wall portion 13c, a metal such as W, or a compound of metal and silicon can also be used. In this case, a compound of the material identical to that of bottom wall portion 13b or vertical wall portion 13c and at least one of nitrogen and oxide can be used for crystallization suppress layer 14. An advantage similar to that using an insulation material can be expected using such a compound. The concept thereof is applicable to each of the subsequent embodiments.

A capacitor dielectric layer 15 of silicon nitride and the like is formed so as to cover capacitor lower electrode 13. A capacitor upper electrode 16 such as of polysilicon is formed on capacitor dielectric layer 15. Capacitor upper electrode 16, capacitor dielectric layer 15, and capacitor lower electrode 13 constitute a capacitor.

A third interlayer insulation layer 17 such as of silicon oxide is formed so as to cover the above capacitor. A contact hole 17a extending to impurity diffusion layer 5d is formed in third interlayer insulation layer 17. An interconnection layer 18d such as of Al is formed in contact hole 17a and on third interlayer insulation layer 17. Interconnection layers 18a, 18b, and 18c such as of Al are formed on third interlayer insulation layer 17 spaced apart from interconnection layer 18d.

A method of fabricating the DRAM of FIG. 1 will be described hereinafter with reference to FIGS. 2–10.

Figure 2:
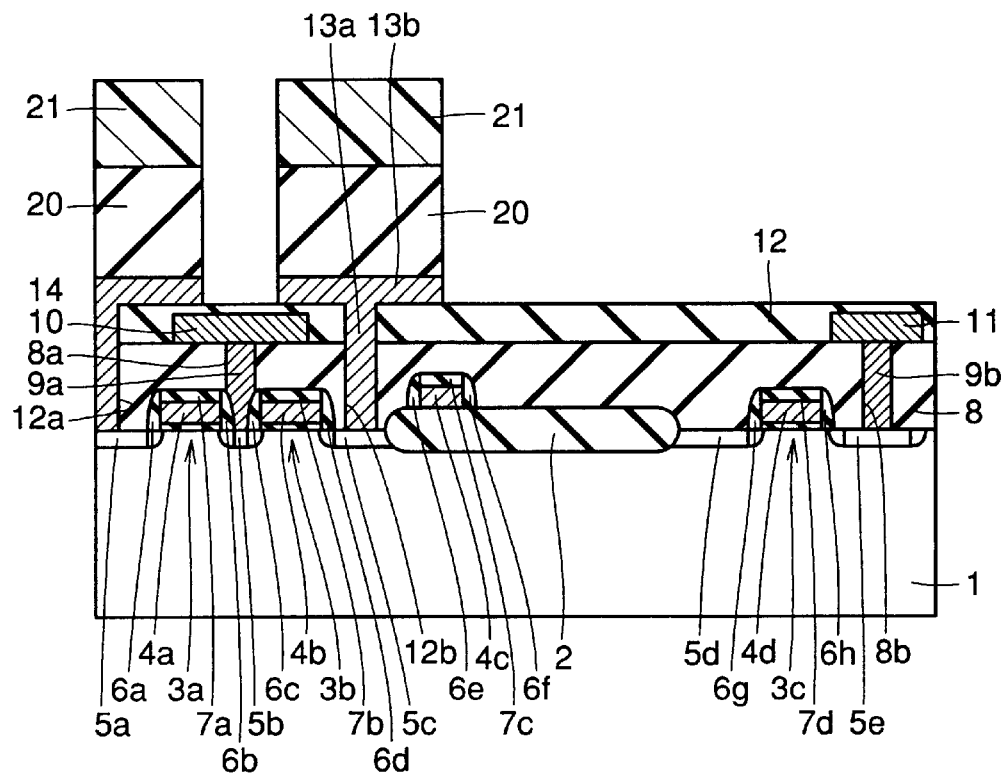
FIGS. 2–10 are sectional views of the DRAM of FIG. 1 corresponding to first to ninth steps, respectively, of a fabrication method thereof.

Referring to FIG. 2, following formation of bit line 10 and interconnection layer 11, second interlayer insulation layer 12 such as of silicon oxide is formed all over the surface thereof. First and second interlayer insulation layers 8 and 12 are selectively etched to have contact holes 12a and 12b formed therein.

An amorphous silicon layer having P doped is formed in contact holes 12a and 12b and on second interlayer insulation layer 12 by CVD. This amorphous silicon layer is formed at the temperature of 500° C.–650° C. using $SiH_4$ gas or $SiH_2Cl_2$ gas.

A silicon oxide layer 20 is formed by CVD so as to cover the amorphous silicon layer. A resist 21 is applied on silicon oxide layer 20. Resist 21 is patterned into a predetermined configuration. Using the patterned resist 21 as a mask, silicon oxide layer 20 and the amorphous silicon layer are patterned, whereby plug portion 13a and bottom wall portion 13b of capacitor lower electrode 13 are formed.

Figure 3:
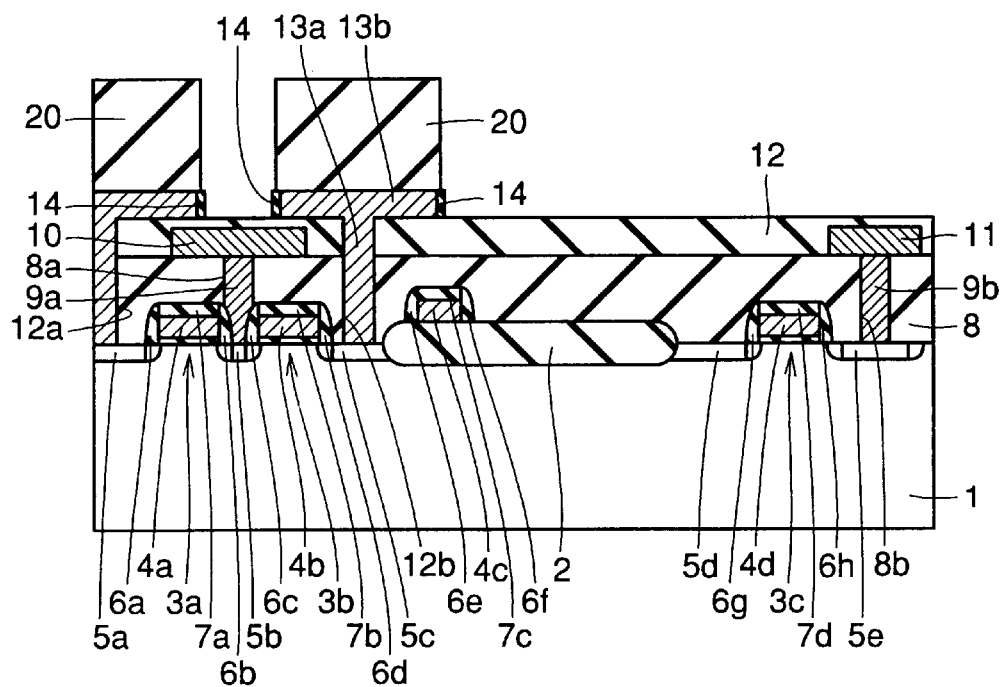

Referring to FIG. 3, following removal of resist 21, crystallization suppress layer 14 such as of silicon oxide or silicon nitride is formed at a thickness of not more than 3 nm on the side surface of bottom wall portion 13b. As a method of forming crystallization suppress layer 14, thermal oxidation in $O_2$ or $H_2O$ atmosphere, oxidation in a $H_2O_2$ solution, or CVD and the like can be enumerated for a silicon oxide crystallization suppress layer 14. In the case of a silicon nitride crystallization suppress layer 14, thermal nitridation in $N_2$ or $NH_3$ atmosphere or CVD can be enumerated.

Figure 4:
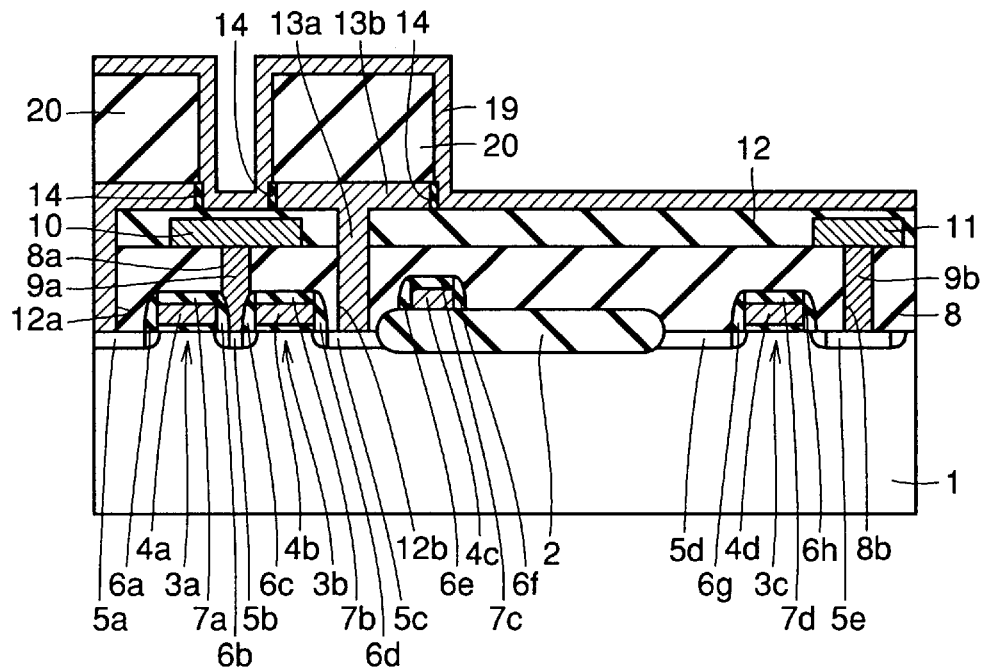
Figure 5:
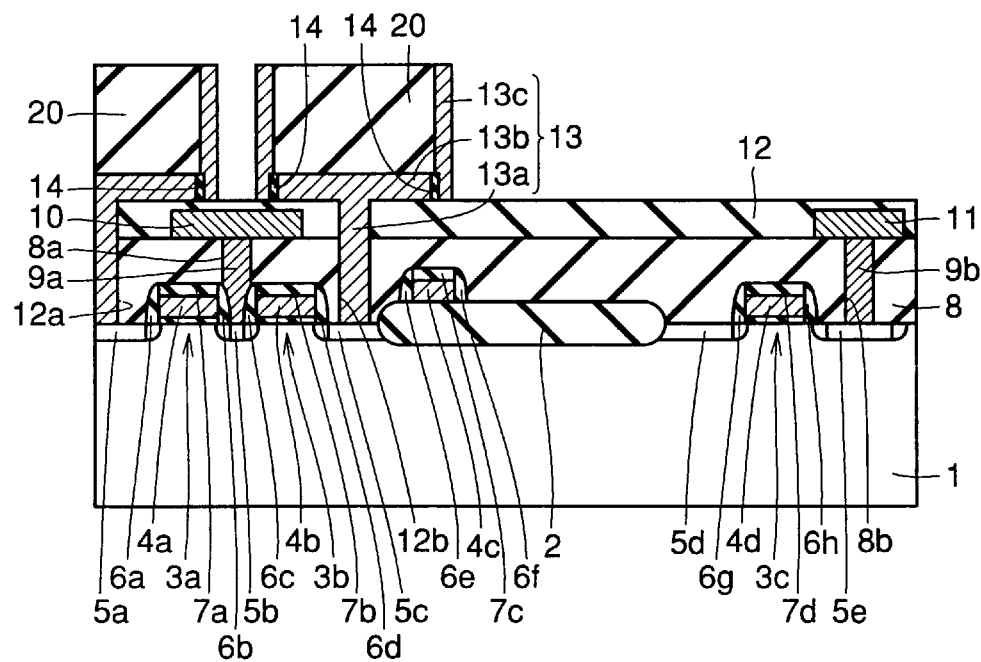
Figure 13:
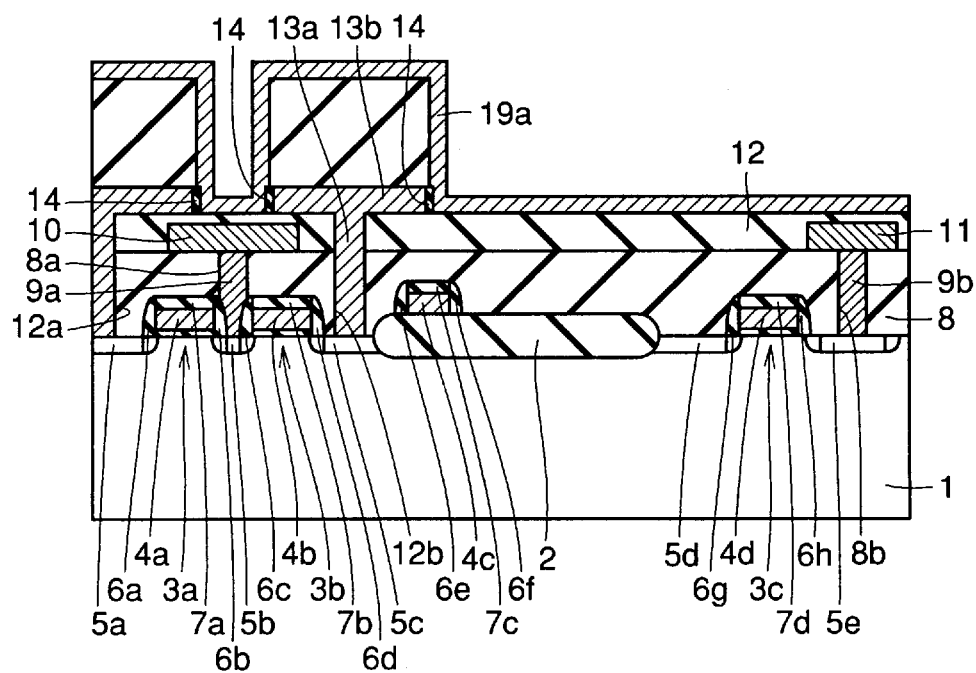
FIGS. 13 and 14 are sectional views of a DRAM according to a fourth embodiment of the present invention showing characteristic first and second steps of a fabrication method thereof.

As shown in FIG. 4, amorphous silicon layer 19 doped with P is formed on second interlayer insulation layer 12 by CVD so as to cover silicon oxide layer 20 and crystallization suppress layer 14. This amorphous silicon layer 19 is formed under conditions identical to those of the above-described amorphous silicon layer. By subjecting amorphous silicon layer 19 to anisotropic etching, vertical wall portion 13c connected to the side surface of bottom wall portion 13b with crystallization suppress layer 14 therebetween can be formed as shown in FIG. 13.

Figure 6:
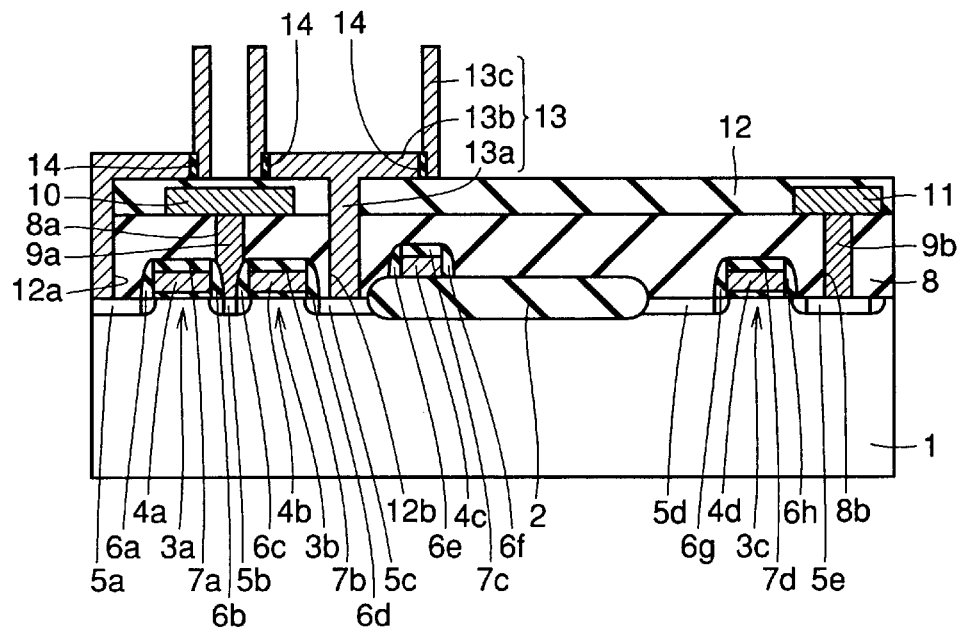

Referring to FIG. 6, silicon oxide layer 20 is removed by etching. Thus, capacitor lower electrode 13 including plug portion 13a, bottom wall portion 13b, vertical wall portion 13c, and insulation layer 14 is formed.

Figure 7:
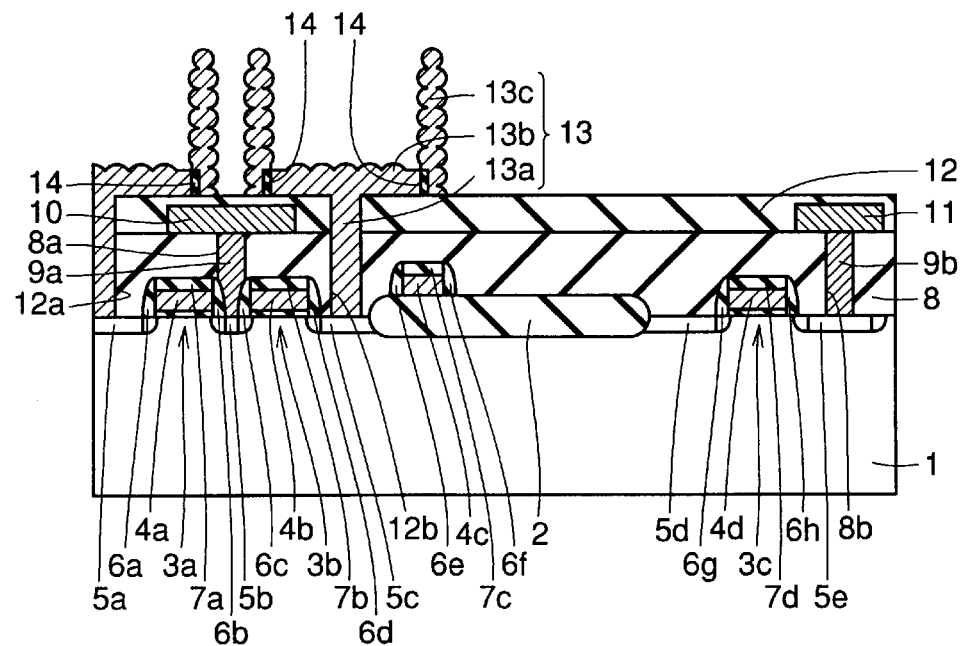

Referring to FIG. 7, bottom wall portion 13b and vertical wall portion 13c are subjected to the corrugation process. Since a thin crystallization suppress layer 14 is present between bottom wall portion 13b and vertical wall portion 13c, crystallization of vertical wall portion 13c can be suppressed effectively even when bottom wall portion 13b is crystallized during the corrugation process. Therefore, at least the surface of vertical wall portion 13c can have a favorable corrugated configuration.

Figure 8:
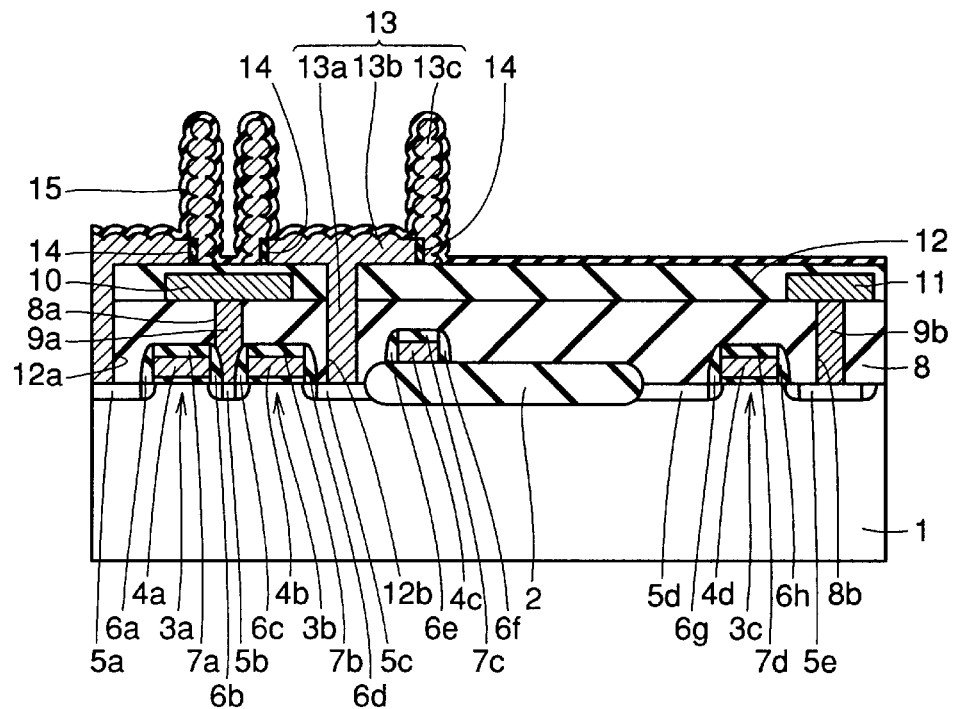
Figure 9:
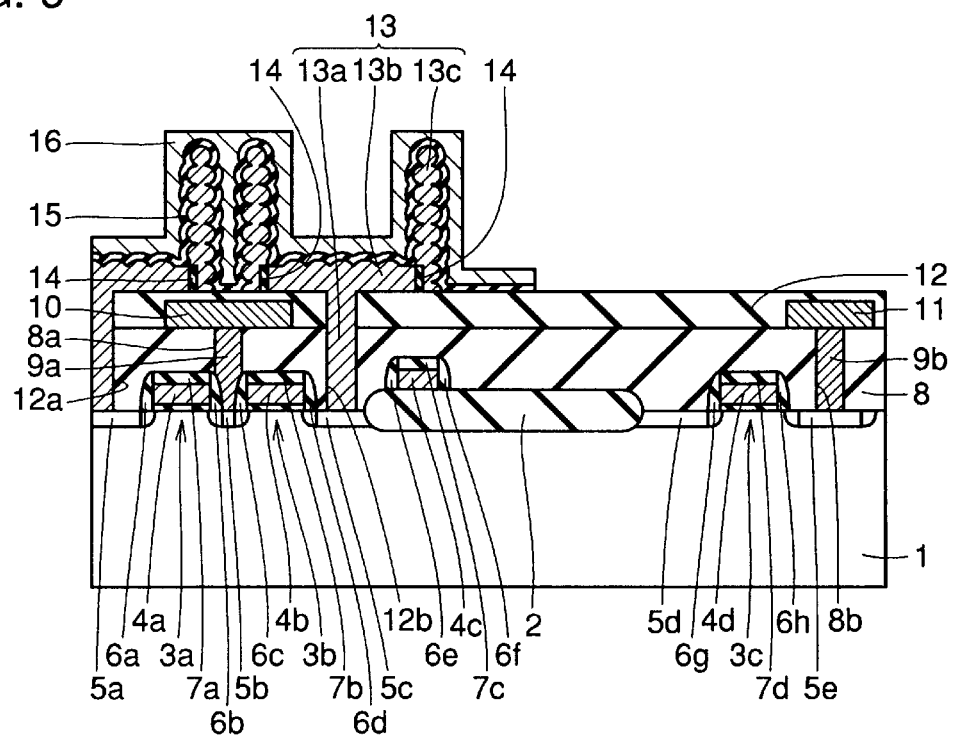

Referring to FIG. 8, capacitor dielectric layer 15 such as of silicon nitride is formed by CVD so as to cover capacitor lower electrode 13. A polysilicon layer doped with impurities is formed by CVD on capacitor dielectric layer 15. This polysilicon layer and capacitor dielectric layer 15 are patterned into a predetermined configuration. Referring to FIG. 9, a capacitor upper electrode 16 is formed on capacitor lower electrode 13 with capacitor dielectric layer 15 therebetween.

Figure 10:
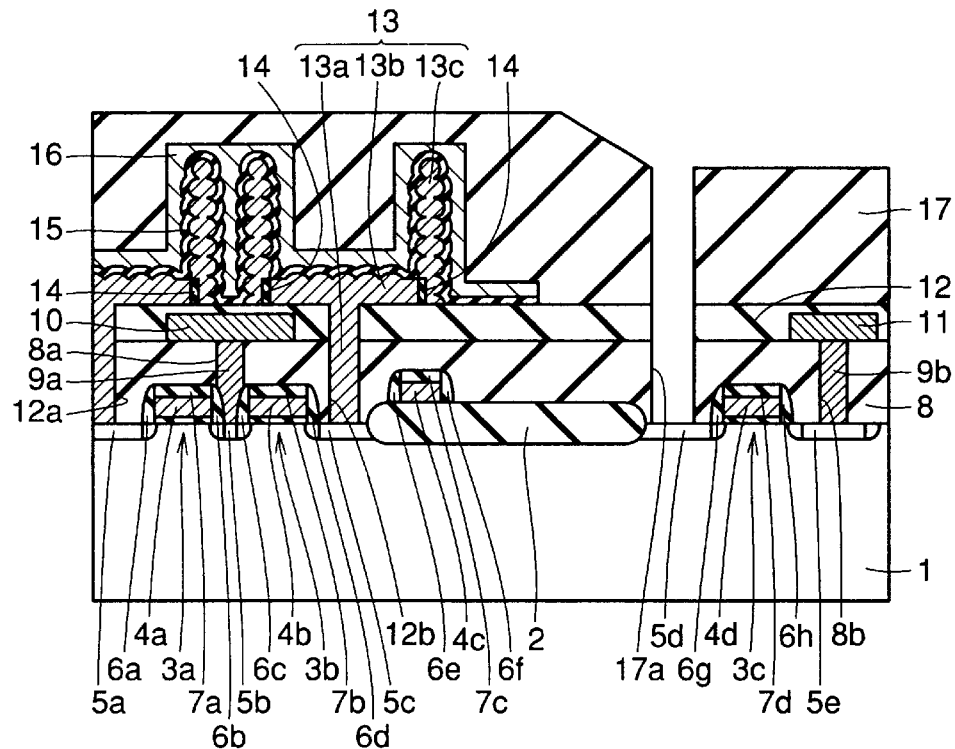

Referring to FIG. 10, third interlayer insulation layer 17 such as of silicon oxide is formed so as to cover capacitor upper electrode 16. A contact hole 17a extending to impurity diffusion layer 5d is formed in third interlayer insulation layer 17. Interconnection layers 18a–18d are formed in contact hole 17a and on third interlayer insulation layer 17. By the above-described fabrication steps, the DRAM of FIG. 1 is formed.

Second Embodiment

Figure 11:
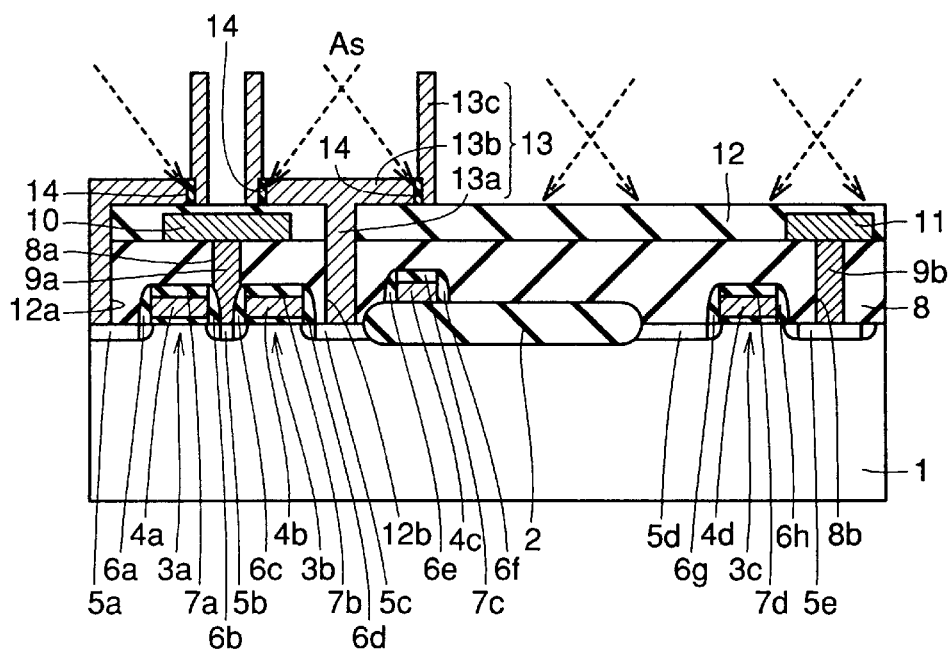
FIG. 11 is a sectional view of a DRAM according to a second embodiment of the present invention corresponding to a characteristic fabrication step.

A second embodiment of the present invention will be described hereinafter with reference to FIG. 11 showing a characteristic fabrication step of the DRAM of the second embodiment.

Referring to FIG. 11, fabrication steps similar to those of the first embodiment are carried out up to the formation of capacitor lower electrode 13. Then, ions are implanted into crystallization suppress layer 14 to destroy the crystal structure thereof. As ions, P ions, Si ions, N ions, and the like can be enumerated as the ion to be implanted.

As shown in FIG. 11, the ions towards crystallization suppress layer 14 are preferably implanted from a direction oblique to the normal of the top surface of bottom wall portion 13b. Implanting impurities from an oblique direction is referred to as "oblique ion implantation" hereinafter.

By implanting impurities into crystallization suppress layer 14 by oblique ion implantation, the crystal structure of crystallization suppress layer 14 is destroyed to provide favorable electrical connection between bottom wall portion 13b and vertical wall portion 13c.

Third Embodiment

Figure 12:
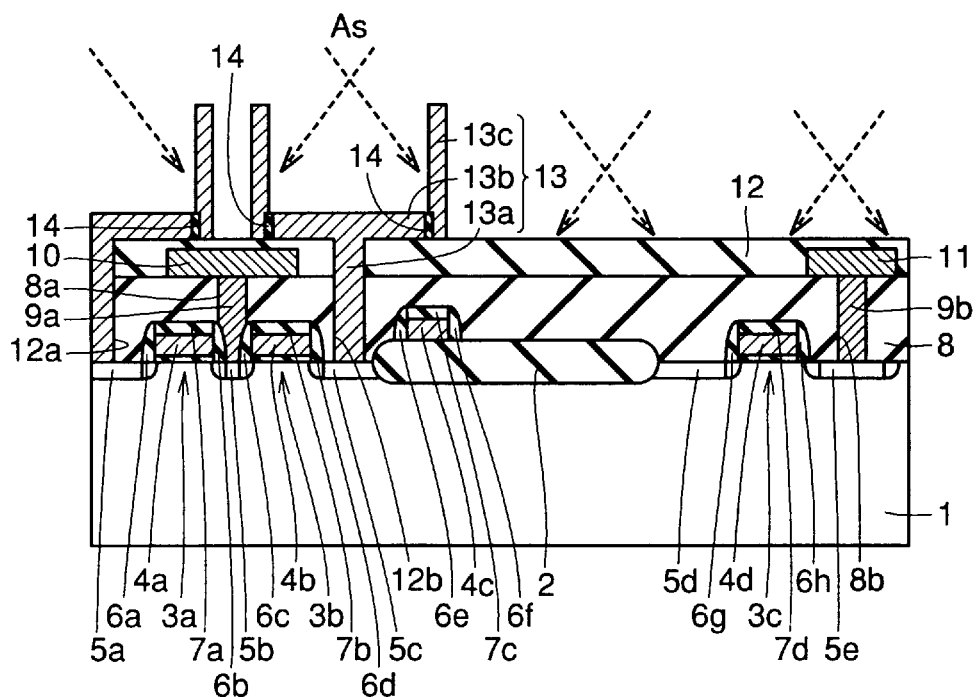
FIG. 12 is a sectional view of a DRAM according to a third embodiment of the present invention corresponding to a characteristic fabrication step.

A third embodiment of the present invention will be described hereinafter with reference to FIG. 12 showing a characteristic fabrication step of the DRAM of the third embodiment.

Referring to FIG. 12, fabrication steps similar to those of the first embodiment are carried out up to the formation of capacitor lower electrode 13. Then, ions such as As, P, Si, N and the like are implanted into vertical wall portion 13c by oblique ion implantation. Then, bottom wall portion 13b and vertical wall portion 13c are subjected to a corrugation process.

By implanting ions as described above to vertical wall portion 13c prior to the corrugation process, vertical wall portion 13c can be rendered amorphous more completely. Therefore, the surface of vertical wall portion 13c can be formed in a favorable corrugated manner more reliably by the corrugation process.

Fourth Embodiment

Figure 14:
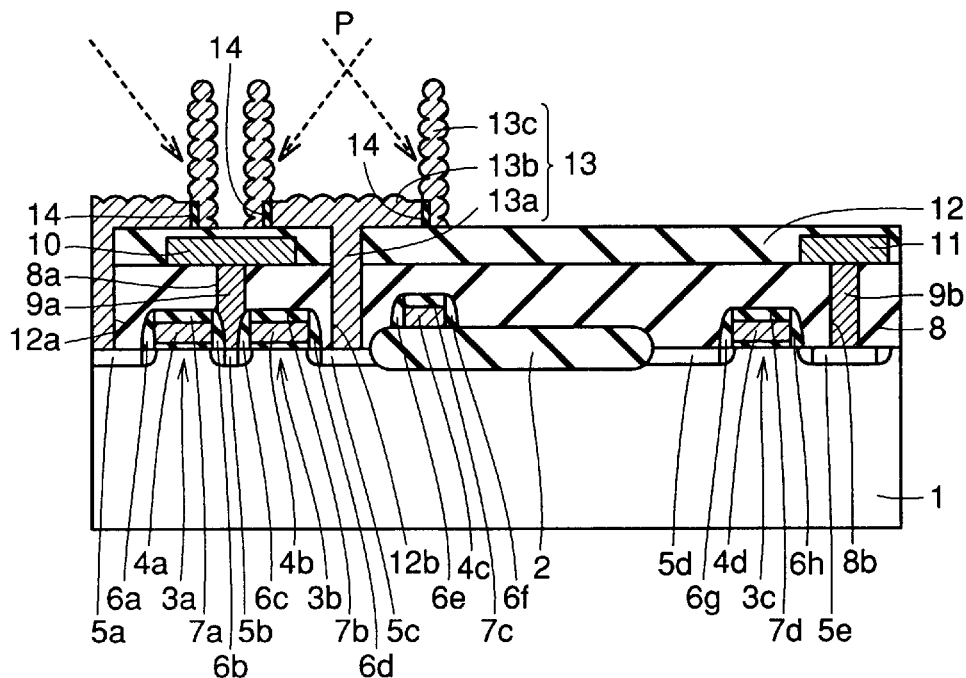

A fourth embodiment of the present invention will be described with reference to FIGS. 13 and 14 showing characteristic fabrication steps of a DRAM according to the fourth embodiment of the present invention.

Fabrication steps similar to those of the first embodiment are carried out up to the formation of silicon oxide layer 20. An undoped amorphous silicon layer 19a that does not have impurities for improving conductivity doped is formed by CVD so as to cover silicon oxide layer 20. Then, fabrication steps up to the corrugation process similar to those described with reference to the first embodiment are carried out. Then, P ions are implanted as shown in FIG. 14 to vertical wall portion 13c that is subjected to the corrugation process by oblique ion implantation. Accordingly, the conductivity of vertical wall portion 13c is improved.

In the previous first embodiment, there is a possibility that a favorable corrugated configuration cannot be achieved due to the usage of P since the corrugation process is applied on vertical wall portion 13c that is doped with P. In the present embodiment, implantation of impurities (P) for improvement of the conductivity of vertical wall portion 13c after the corrugation process provides the advantage that the possibility of a favorable corrugated configuration of the surface of vertical wall portion 13c not achieved by the usage of P can be eliminated. Therefore, further favorable corrugated configuration can be achieved.

Although P is doped into bottom wall portion 13b, the P therein will not diffuse to vertical wall portion 13c since crystallization suppress layer 14 is present between bottom wall portion 13b and vertical wall portion 13c. In other words, crystallization suppress layer 14 functions as a layer to prevent impurity diffusion in this case.

Fifth Embodiment

Figure 15:
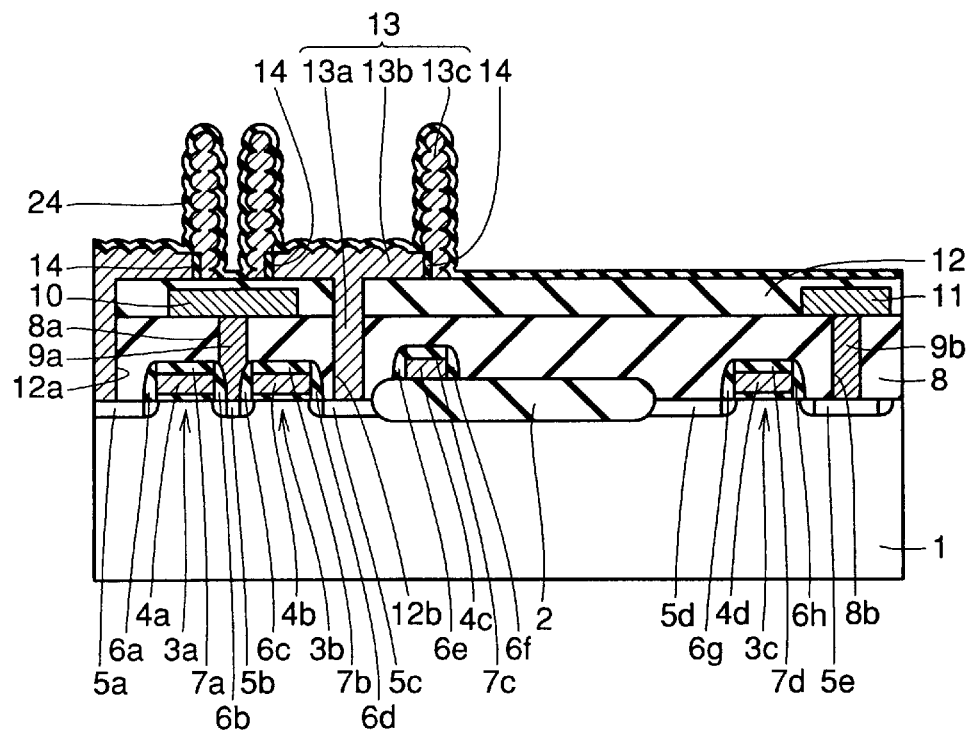
FIG. 15 is a sectional view of a DRAM according to a fifth embodiment of the present invention corresponding to a characteristic fabrication step thereof.

A fifth embodiment of the present invention will be described hereinafter with reference to FIG. 15 showing a characteristic fabrication step of the DRAM of the fifth embodiment.

In the previous fourth embodiment, there is a possibility that the corrugated configuration of the surface of vertical wall portion 13c is altered by implanting P into vertical wall portion 13c after the corrugation process. In the worst case, the surface area increase of vertical wall portion 13c can be degraded.

The above problem can be solved by introducing P into vertical wall portion 13c by a method other than ion implantation. Such a method includes the step of forming diphosphorous pentaoxide ($P_2O_5$) so as to cover capacitor lower electrode 13 to introduce P into vertical wall portion 13c by thermal diffusion as shown in FIG. 15. By using this method, the favorable corrugated configuration of the surface of vertical wall portion 13c can be maintained to prevent reduction in the surface area increase. A method besides the above thermal diffusion method can be employed as long as it is not the ion implantation method.

Sixth Embodiment

A sixth embodiment of the present invention will be described with reference to FIGS. 16–28.

Figure 16:
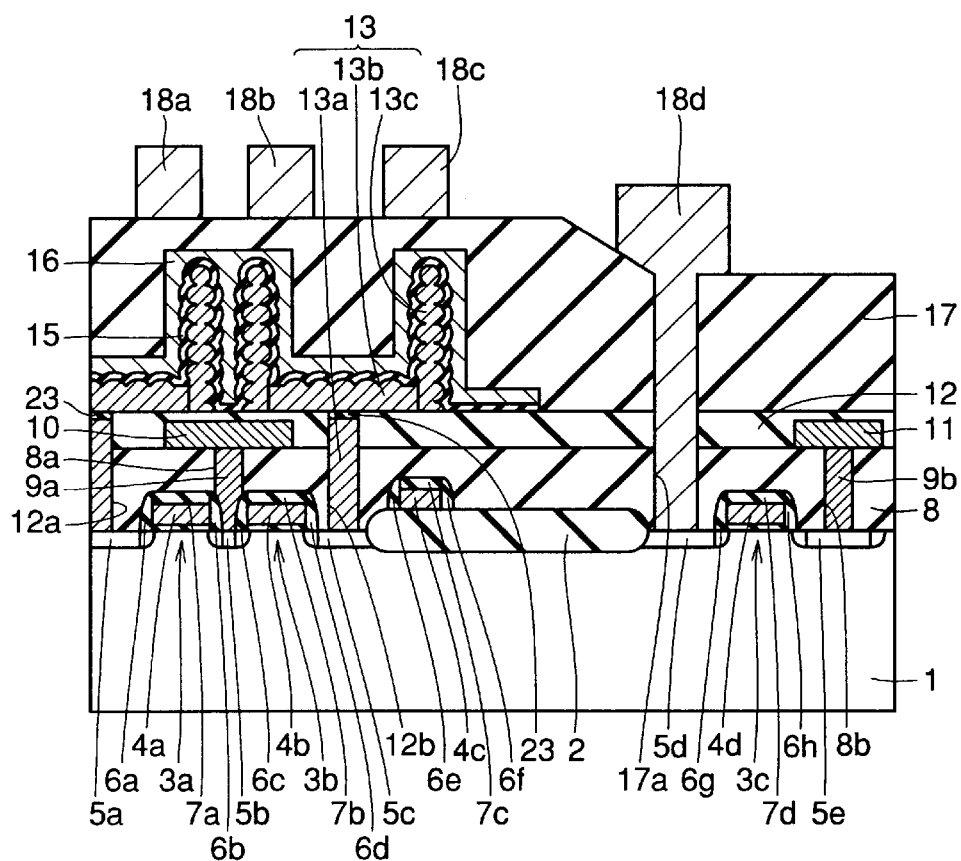
FIG. 16 is a sectional view of a DRAM according to a sixth embodiment of the present invention.

Referring to FIG. 16 showing a sectional view of a DRAM of the sixth embodiment, an insulation layer 23 is provided between plug portion 13a and bottom wall portion 13b. The remaining structure is similar to that of the DRAM of FIG. 1.

The provision of insulation layer 23 between plug portion 13a and bottom wall portion 13b allows suppression of crystallization of bottom wall portion 13b in addition to vertical wall portion 13c. Therefore, the surface of bottom wall portion 13b can have a favorable corrugated configuration formed similar to that of the surface of vertical wall portion 13c. As a result, the surface area increase of capacitor lower electrode 13 can be further improved than that of the first embodiment.

The fabrication method of the DRAM of the sixth embodiment will be described hereinafter with reference to FIGS. 17–28.

Figure 17:
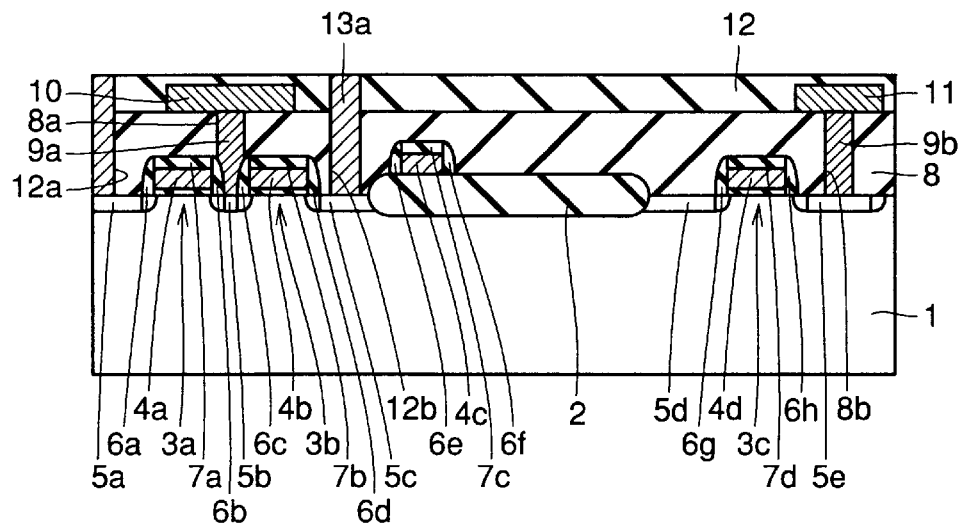
FIGS. 17–28 are sectional views of the DRAM of FIG. 16 corresponding to characteristic first to twelfth steps, respectively, of the present invention.

Referring to FIG. 17, fabrication steps similar to those of the first embodiment are carried out up to the formation of amorphous silicon layer 18. Amorphous silicon layer 18 is subjected to an etch back process or a CMP (Chemical Mechanical Polishing) process. As a result, plug portion 13a is formed in contact hole 12b.

Figure 18:
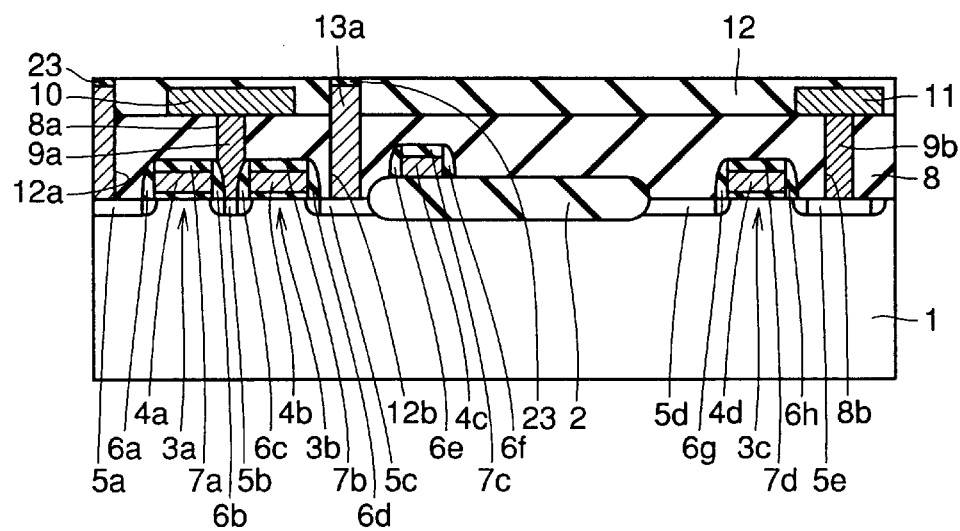
Figure 19:
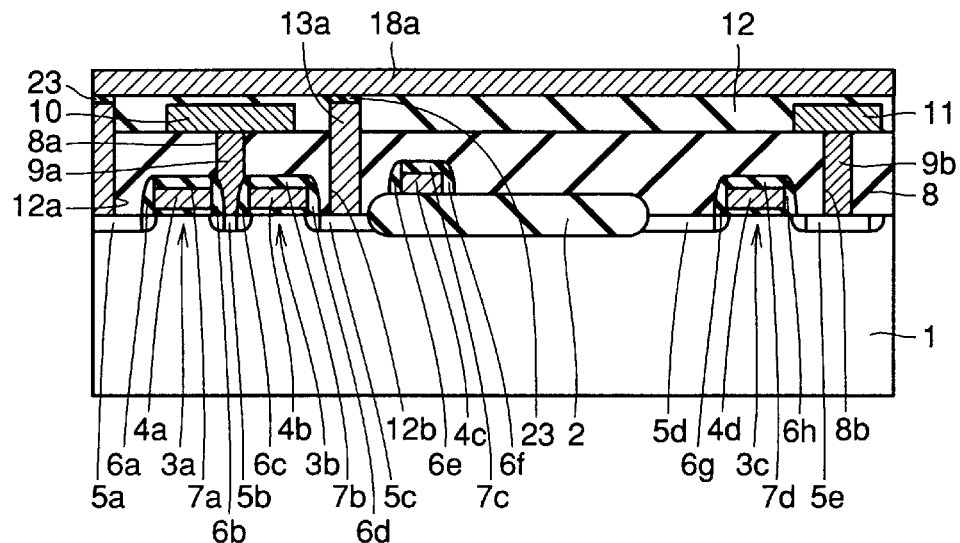

Referring to FIG. 18, crystallization suppress layer 23 of a material identical to that of crystallization suppress layer 14 is formed on the top surface of plug portion 13a by a method similar to that of the first embodiment. Referring to FIG. 19, an amorphous silicon layer 18a doped with P is formed on crystallization suppress layer 23 according to fabrication steps similar to those of the aforementioned amorphous silicon layer.

Figure 20:
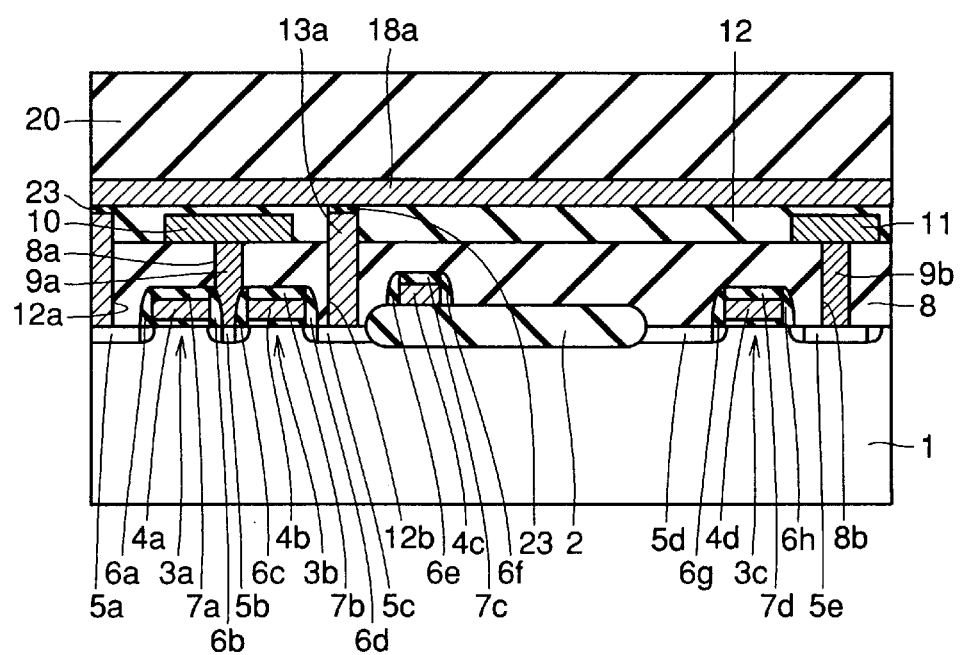
Figure 21:
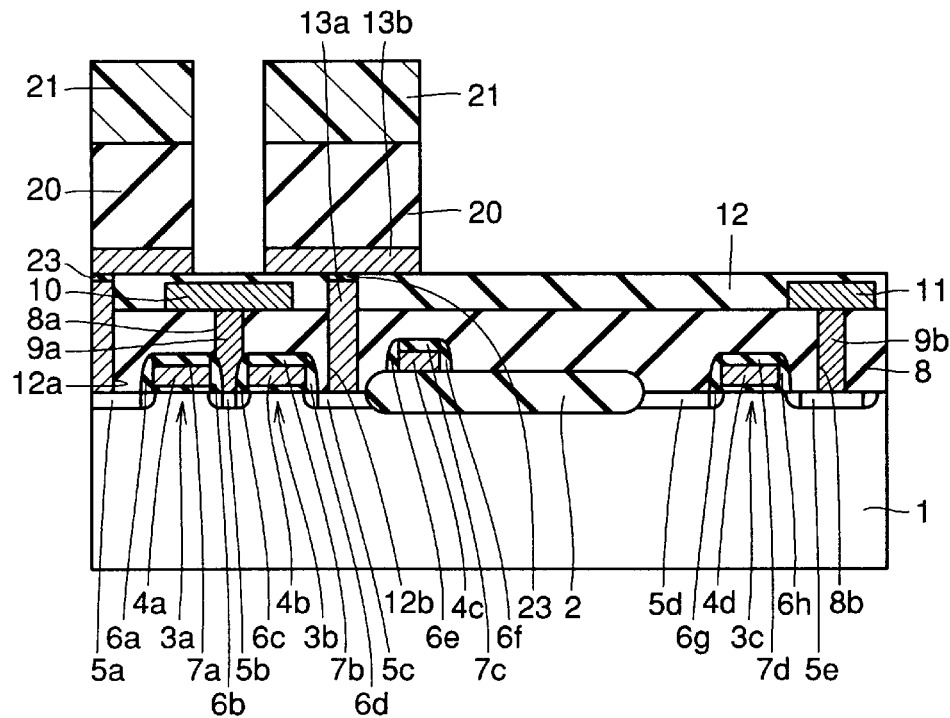

Referring to FIG. 20, a silicon oxide layer 20 is formed on amorphous silicon layer 18a according to a fabrication step similar to that described in the first embodiment. A resist 21 is applied on silicon oxide layer 20. Referring to FIG. 21, resist 21 is patterned. Using the patterned resist 21 as a mask, silicon oxide layer 20 and amorphous silicon layer 18a are sequentially patterned. As a result, plug portion 13a and bottom wall portion 13b are formed that are electrically connected with crystallization suppress layer 23 therebetween.

Figure 22:
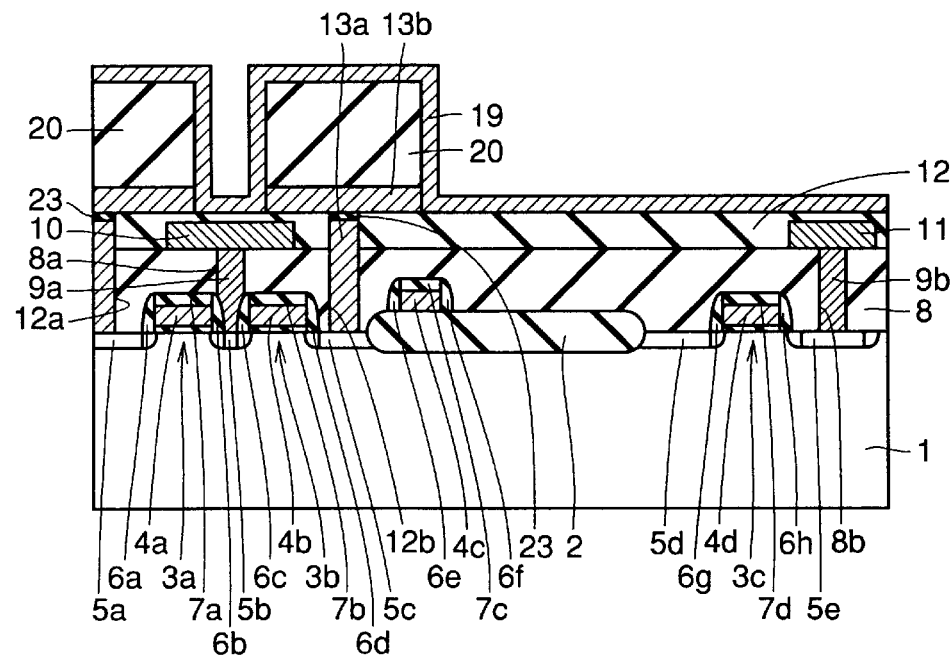
Figure 23:
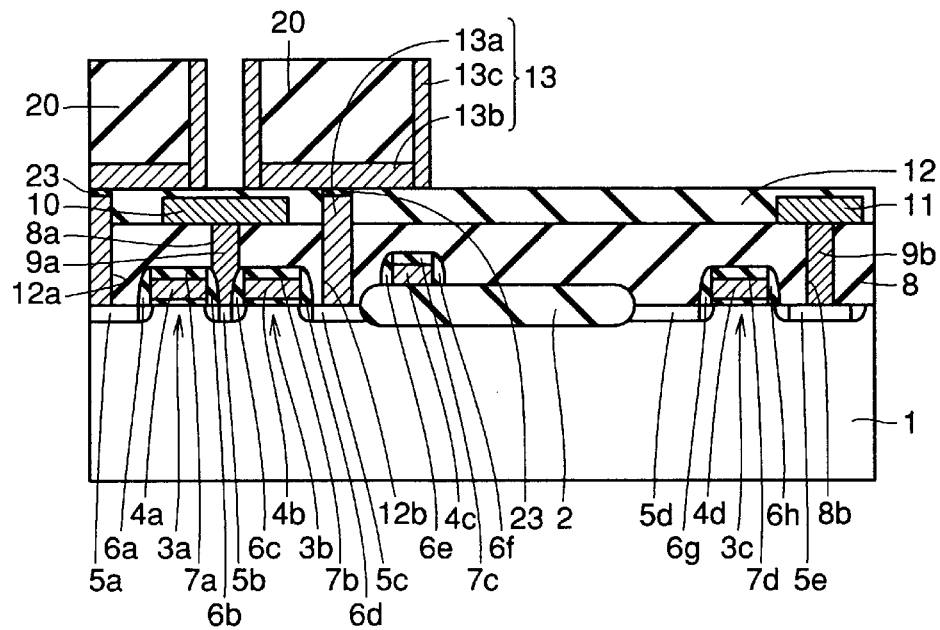
Figure 24:
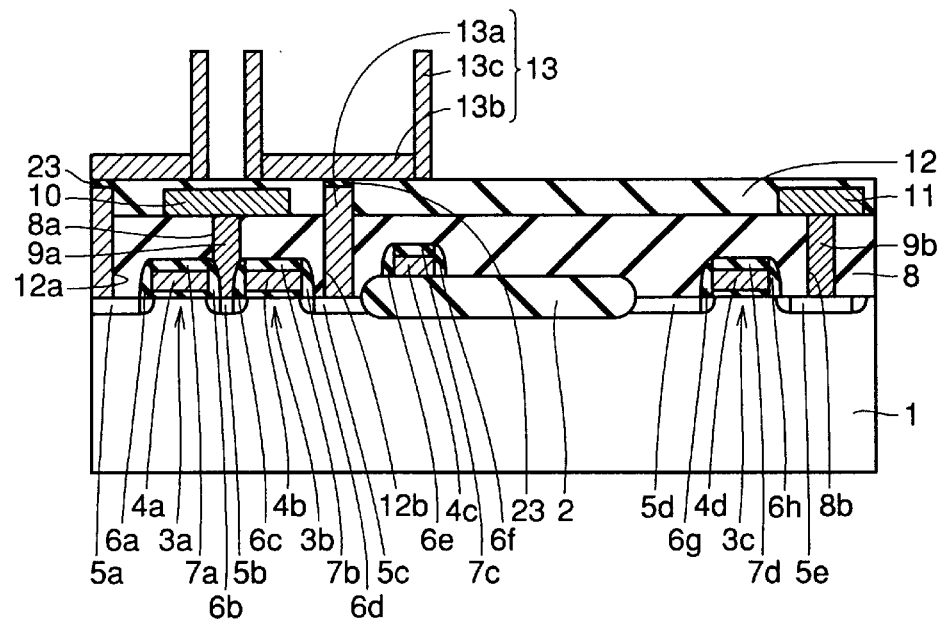

Referring to FIG. 22, amorphous silicon layer 19 is formed by fabrication steps similar to those of the first embodiment. Referring to FIG. 23, amorphous silicon layer 19 is etched anisotropically. Then, silicon oxide layer 20 is removed to form capacitor lower electrode 13 as shown in FIG. 24.

Figure 25:
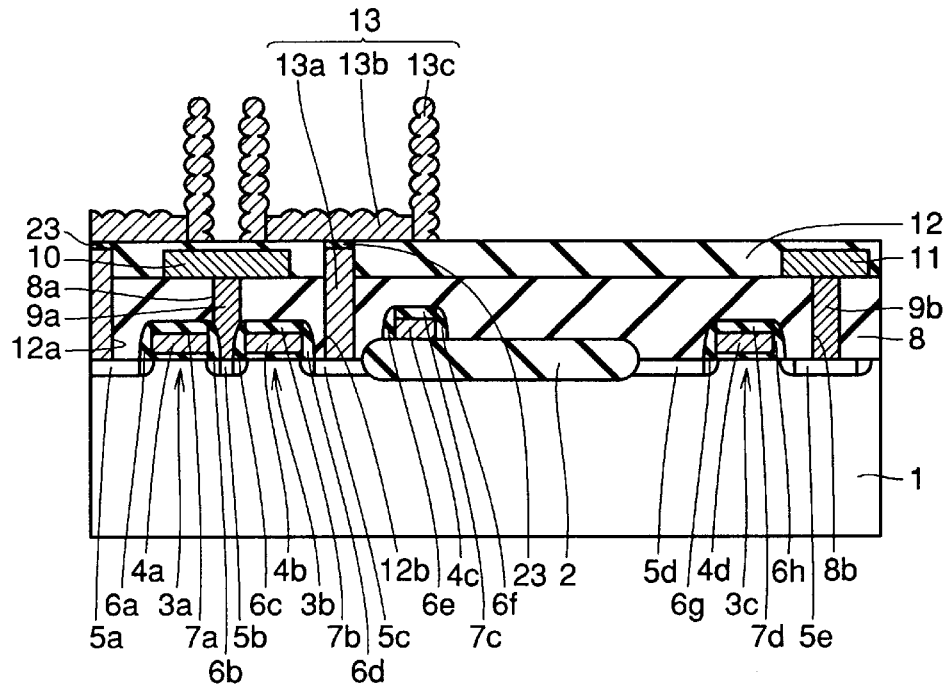

Referring to FIG. 25, bottom wall portion 13b and vertical wall portion 13c are subjected to a corrugation process by fabrication steps similar to those described in the first embodiment. Although plug portion 13a is crystallized during the corrugation process, crystallization of bottom wall portion 13b and vertical wall portion 13c is suppressed by virtue of crystallization suppress layer 23. Therefore, the top surface of bottom wall portion 13b can be formed in a favorable corrugated configuration in addition to the surface of vertical wall portion 13c.

Figure 26:
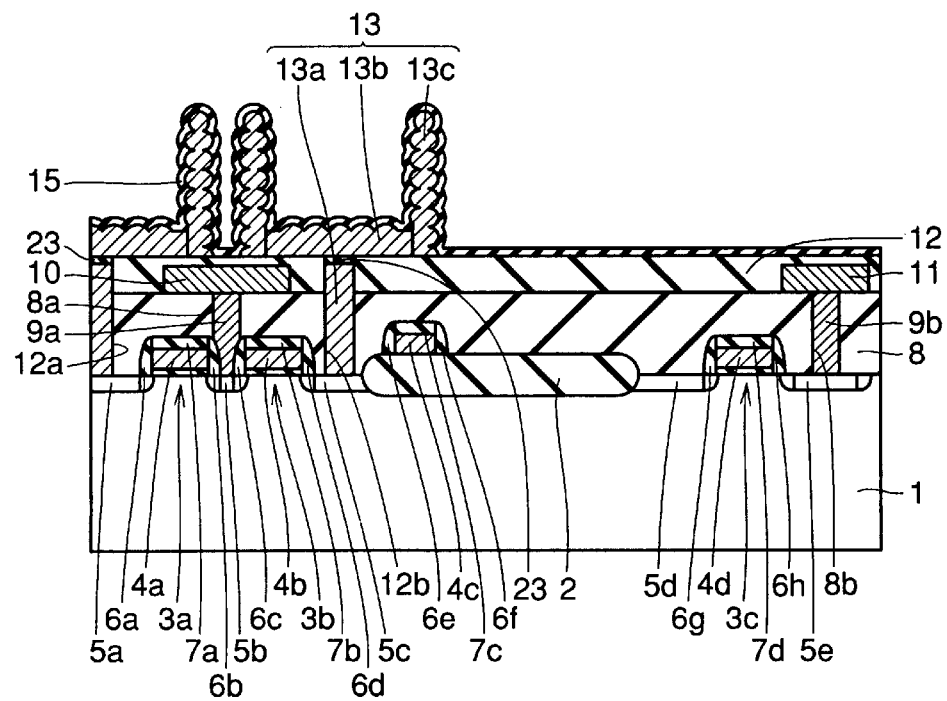
Figure 27:
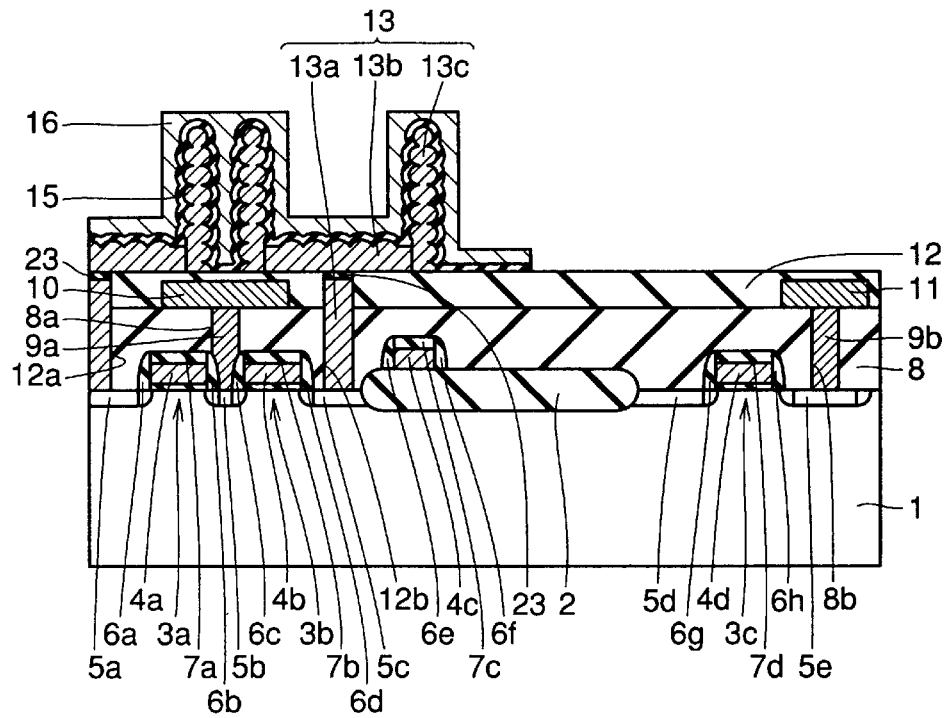
Figure 28:
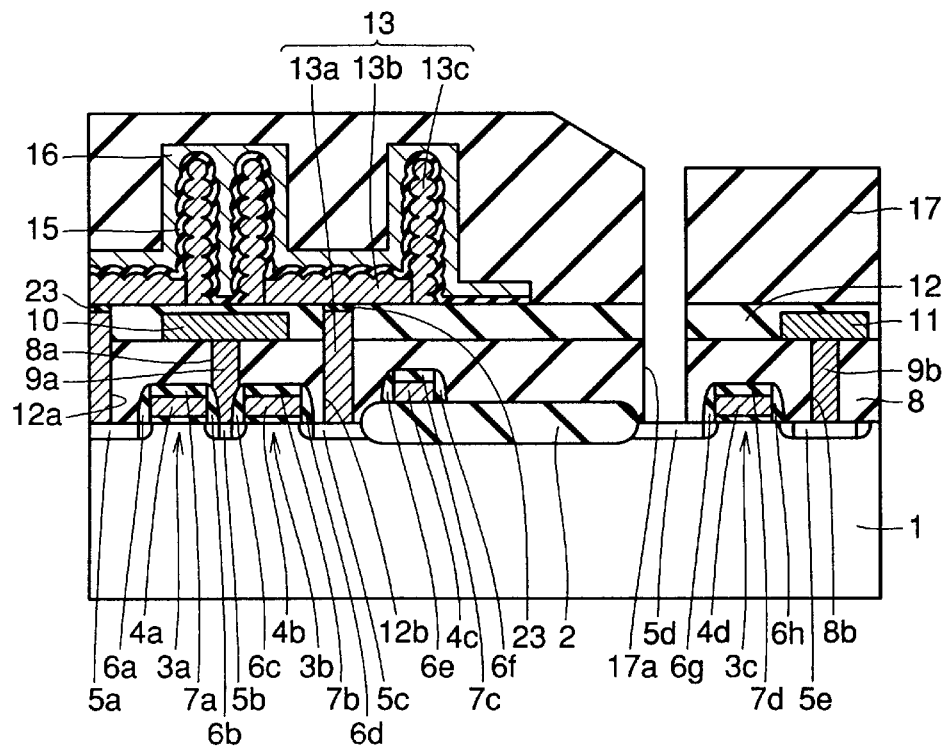

Referring to FIGS. 26–28, capacitor dielectric layer 15, capacitor upper electrode 16, third interlayer insulation layer 17, and interconnection layers 18a–18d are formed according to fabrication steps similar to those described in the first embodiment. Thus, the DRAM shown in FIG. 16 is formed.

Seventh Embodiment

Figure 29:
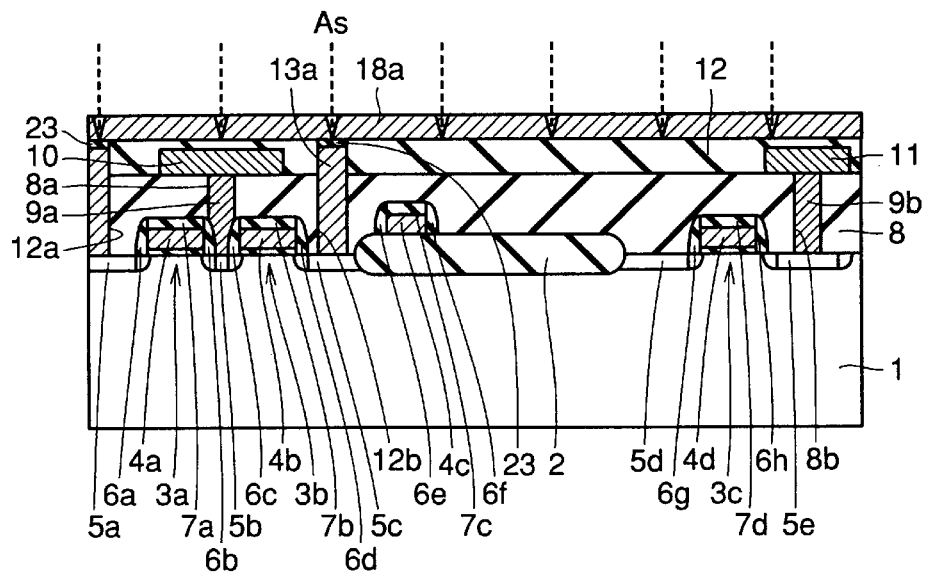
FIG. 29 is a sectional view of a DRAM according to a seventh embodiment of the present invention corresponding to a characteristic fabrication step thereof.

A seventh embodiment of the present invention will be described with reference to FIG. 29 showing a characteristic fabrication step thereof.

Similar to the second embodiment, ion implantation is carried out to destroy the crystal structure of crystallization suppress layer 23 in the present seventh embodiment. The ions are similar to those described in the second embodiment. By implanting ions into crystallization suppress layer 23, favorable electrical connection between plug portion 13a and bottom wall portion 13b can be achieved.

Eighth Embodiment

Figure 30:
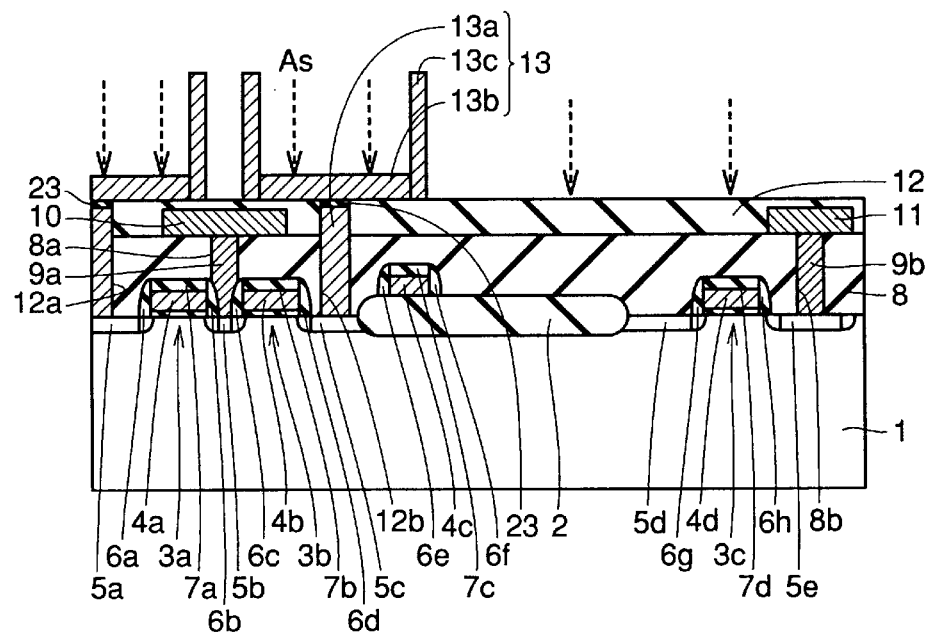
FIG. 30 is a sectional view of a DRAM according to an eighth embodiment of the present invention corresponding to a characteristic fabrication process thereof.
Figure 31:
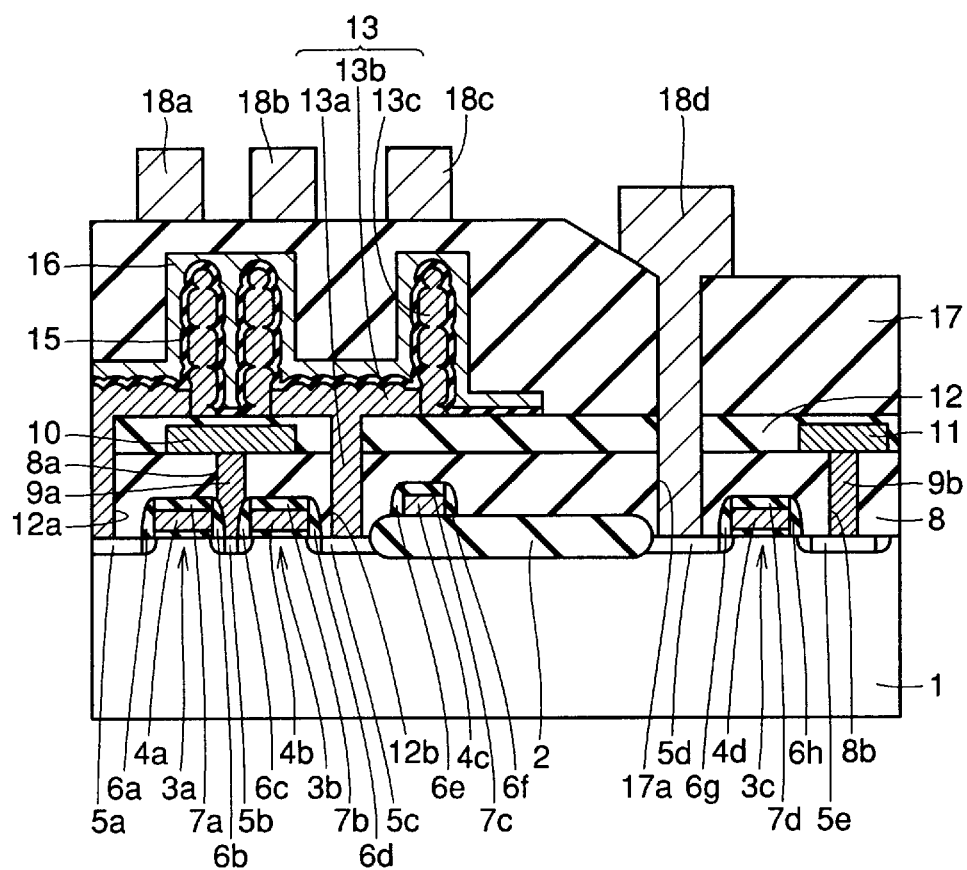
FIG. 31 is a sectional view of a conventional DRAM.

An eighth embodiment of the present invention will be descried with reference to FIG. 30 showing a characteristic fabrication step thereof.

In the previous sixth embodiment, there is a possibility that bottom wall portion 13b may be slightly crystallized by the heat treatment in the CVD process to form silicon oxide layer 20 and vertical wall portion 13c. In this case, the surface of bottom wall portion 13b cannot have a favorable corrugated configuration formed, and the surface area increase will be reduced.

In the present eighth embodiment, fabrication steps similar to those of the sixth embodiment are carried out up to the formation of vertical wall portion 13c. Referring to FIG. 30, ions are implanted into bottom wall portion 13b to render the same to a more complete amorphous state. Ions are similar to those described in the third embodiment. By implanting ions into bottom wall portion 13b after formation of capacitor lower electrode 13, bottom wall portion 13b can be rendered amorphous more completely. Therefore, a favorable corrugated configuration can be formed at the top surface of bottom wall portion 13b.

Ninth Embodiment

In the previous sixth embodiment, impurities such as P is doped for improving the conductivity into bottom wall portion 13b and vertical wall portion 13c prior to the corrugation process, likewise the first embodiment. In this case, there is a possibility that the surfaces of bottom wall portion 13b and vertical wall portion 13c cannot be corrugated favorably due to the presence of P as in the fourth embodiment.

In the present ninth embodiment, amorphous silicon layer 18a corresponding to formation of bottom wall portion 13b and amorphous silicon layer 19 corresponding to the formation of vertical wall portion 13c are amorphous silicon layers that do not have impurities doped to improve conductivity. Likewise the fourth embodiment, favorable corrugated configuration can be formed at the top surface of bottom wall portion 13b and at the surface of vertical portion 13c. In this case, crystallization suppress layer 23 functions as a layer to prevent impurity diffusion. Then, impurities such as P is doped into bottom wall portion 13b and vertical wall portion 13c to improve conductivity.

Similar to the fifth embodiment, the impurities for improving conductivity can be introduced into bottom wall portion 13b and vertical wall portion 13c by a method other than ion implantation. Accordingly, favorable corrugated configuration is maintained, and reduction in the surface area of capacitor lower electrode 13 can be prevented effectively.

According to the semiconductor memory device of the present invention, at least the second conductor can be maintained in an amorphous state during the corrugation process. Therefore, the surface area increase can be improved. Thus, the capacitance of the capacitor of the semiconductor device can be increased.

According to a method of fabricating a semiconductor memory device of the present invention, the second conductor is formed on the surface of the first conductor with a thin film therebetween. Therefore, crystallization of the second conductor can be suppressed effectively. Accordingly, the surface area increase of the second conductor can be improved. Thus, a semiconductor memory device increased in the capacitance of a capacitor can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a semiconductor substrate having a main surface;

one electrode of a capacitor having a surface subjected to a corrugation process, and including a first conductor connected to said main surface and a second conductor electrically connected to said first conductor; and a crystallization suppress portion between said first and second conductors for suppressing crystallization of said second conductor during the corrugation process.

2. The semiconductor memory device according to claim 1, wherein said crystallization suppress portion is formed of a layer of an insulation material with a thickness of not more than 3 nm.

3. The semiconductor memory device according to claim 1, wherein said crystallization suppress portion is formed of a compound of a material of said one electrode of a capacitor and at least one of nitrogen and oxygen, and has a thickness of not more than 3 nm.

4. A semiconductor memory device comprising:

a semiconductor substrate having a main surface;

one electrode of a capacitor having a surface subjected to a corrugation process, and including a first conductor connected to said main surface and a second conductor electrically connected to said first conductor; and a crystallization suppress portion between said first and second conductors for suppressing crystallization of said second conductor;

wherein said first conductor is a plug portion connected to said main surface, and wherein said second conductor includes a bottom wall portion formed on said plug portion with said crystallization suppress portion therebetween, and a vertical wall portion connected to a side surface of said bottom wall portion.

5. A semiconductor memory device comprising:

a semiconductor substrate having a main surface;

one electrode of a capacitor having a surface subjected to a corrugation process, and including a first conductor connected to said main surface and a second conductor electrically connected to said first conductor; and a crystallization suppress portion between said first and second conductors for suppressing crystallization of said second conductor;

wherein said first conductor includes a plug portion connected to said main surface and a bottom wall portion formed on said plug portion, and wherein said second conductor is a vertical wall portion connected to a side surface of said bottom wall portion with said crystallization suppress portion therebetween.

6. The semiconductor memory device according to claim 1, wherein said first conductor includes a horizontal bottom wall portion and said second conductor includes a vertical wall portion.

* * * * *

UNITED STATES PATENT AND TRADEMARK OFFICE
CERTIFICATE OF CORRECTION

PATENT NO.    : 6,087,694
DATED         : July 11, 2000
INVENTOR(S)   : Yoshikazu Ohno, et al.

It is certified that error appears in the above-identified patent and that said Letter Patent is hereby corrected as shown below:

On the Title page:

Section [30], under Foreign Application Priority Data, change the filing date of Japanese application number 10-015405 from "January 25, 1998" to --January 28, 1998--.

Signed and Sealed this

Seventeenth Day of April, 2001

*Attest:*

NICHOLAS P. GODICI

*Attesting Officer*     *Acting Director of the United States Patent and Trademark Office*